US008102672B2

(12) United States Patent
Wu et al.

(10) Patent No.: US 8,102,672 B2

(45) Date of Patent: Jan. 24, 2012

(54) DEVICE WITH BUTTON GUIDING ELEMENT

(75) Inventors: Tsung-Yao Wu, Taipei (TW); Hsin-Chih Liu, Taipei (TW)

(73) Assignee: Inventec Appliances Corp., Taipei (TW)

( * ) Notice: Subject to any disclaimer, the term of this patent is extended or adjusted under 35 U.S.C. 154(b) by 829 days.

(21) Appl. No.: 12/155,418

(22) Filed: Jun. 4, 2008

(65) Prior Publication Data

US 2009/0002975 A1 Jan. 1, 2009

(30) Foreign Application Priority Data

Jun. 26, 2007 (TW) ............................... 96123125 A

(51) Int. Cl.
*H05K 7/02* (2006.01)
*H05K 7/04* (2006.01)

(52) U.S. Cl. ........................................ 361/807; 361/810

(58) Field of Classification Search ........... 361/807–810
See application file for complete search history.

(56) References Cited

U.S. PATENT DOCUMENTS

| | | | | |
|---|---|---|---|---|
| 3,898,421 | A * | 8/1975 | Suzumura | 200/517 |
| 7,193,859 | B2 * | 3/2007 | Horiuchi | 361/756 |
| 2008/0087476 | A1 * | 4/2008 | Prest et al. | 178/18.01 |

* cited by examiner

*Primary Examiner* — Hung S Bui

(74) *Attorney, Agent, or Firm* — Birch, Stewart, Kolasch & Birch, LLP

(57) ABSTRACT

A device with a button guiding element comprises a device substance, a button, a button guiding element, and a circuit board. The device substance has a button opening. The button comprises a button substance, a first fixing element, a second fixing element, and a driving element. The button substance is located in the button opening. The first fixing element is fixed to the first side of the button substance and engages with the device substance. The second fixing element is fixed to the second side of the button substance. The driving element is located on the button substance. The circuit board has a driving point, which is spaced apart from and in alignment with the driving element. The button guiding element disposed in the device substance is used to restrict the motion of the second fixing element to reduce the occurrence of a situation in which the button is obliquely positioned.

9 Claims, 2 Drawing Sheets

DEVICE WITH BUTTON GUIDING ELEMENT

BACKGROUND OF THE INVENTION

1. Field of the Invention

The present invention relates to a device with a button guiding element, more particularly to a device that is applied with a press-type button.

2. Description of the Prior Art

Generally a device has at least a button in order to provide setting functions. Referring to FIG. 1*a*, which illustrates a schematic view of a device with a button in prior arts. The device includes a device substance 100, a button 110 and a circuit board 120.

The device substance 100 has a button opening. The button 110 includes a button substance 111, a first fixing element 112, a second fixing element 113, and a driving element 114. The button substance 111 is located in the button opening, and bulges out from the surface of the device substance 100, and the button substance 111 has a first side and a second side. The first fixing element 112 is fixed to the first side of the button substance 111, and engages with the device substance 100. The second fixing element 113 is fixed to the second side of the button substance 111. The driving element 114 is located on the button substance 111 near the first side of the button substance 111. The circuit board 120 is located within the device substance 100 and has a driving point 121 exactly facing the driving element 114.

Referring to FIG. 1*b*, which illustrates an action view of a device with a button in prior arts. When the button substance 111 is pressed, the driving element 114 is going to force the driving point 121. The driven driving point 121 will lead to the circuit board 120 to act functions. However, when the button 110 is pressed down, the button 110 will be deviated easily because of no support. Therefore, it causes defects, which are listed as follows.

1. Users can't ensure whether they press the driving point exactly or not.
2. The driving point can't be driven easily.
3. The button will be stuck easily.
4. The button will be damaged easily.
5. When the button is obliquely positioned, a larger force shall be applied.

Therefore, to solve the problems caused from the prior arts is an important issue to the skilled persons in the art.

SUMMARY OF THE INVENTION

One object of the present invention is to provide a device with a button guiding element to restrict the motion of the second fixing element and thus decrease a situation of the button being obliquely positioned.

According to one embodiment of the present invention, the device comprises a device substance, a button, a button guiding element, and a circuit board. The device substance has a button opening, and the button includes a button substance, a first fixing element, a second fixing element, and a driving element. The button substance is located in the button opening and bulges out from the surface of the device substance, and the button substance has a first side and a second side. The first fixing element is fixed to the first side of the button substance and engages with the device substance. The second fixing element is fixed to the second side of the button substance. The driving element is located on the button substance near the first side of the button substance. In one embodiment of the present invention, the circuit board is located within the device substance, and has a driving point, which is located correspondingly to the driving element. In one aspect of the present invention, the button guiding element is deposed in the device substance and has a purpose of restricting the motion of the second fixing element.

When users press the button substance, the button guiding element restricts the motion of the second fixing element and thereby guides the driving element to activating the driving point of the circuit board. The activated driven driving point thus drives the circuit board to perform functions.

BRIEF DESCRIPTION OF THE DRAWINGS

The present invention will be more fully understood from the detailed description, which will be given hereinafter, with the aid of the illustrations below.

DESCRIPTION OF THE PREFERRED EMBODIMENT

Nowadays common devices such as cellular phone, camera, remote controller, and media player generally have at least a button to enable users to set functions of the device according to their needs, but the buttons could often be easily stuck on being pressed. The present invention provides an advanced structure to solve the problem, and detailed description of the present invention is as below.

Figure 1:
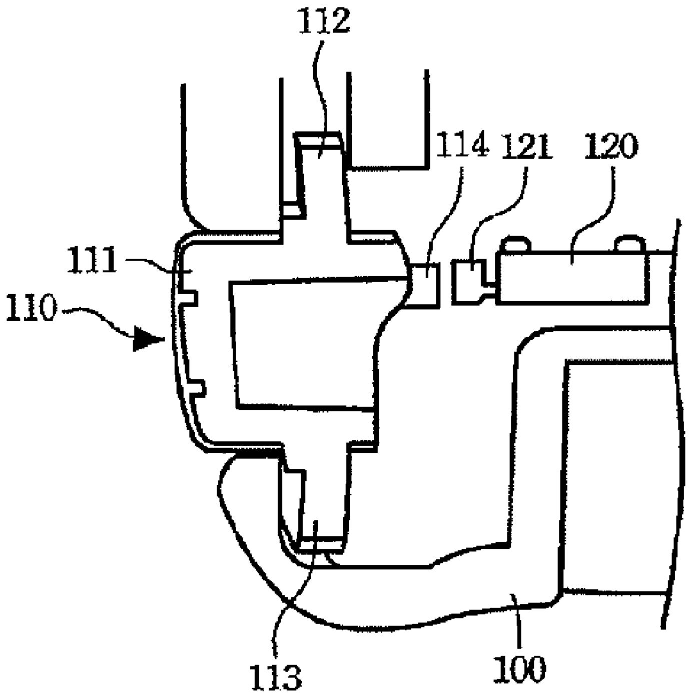
F I G . 1 a (Prior Art)
FIG. 1*a* shows a schematic view of a device with a button in the prior art.
FIG. 1*b* shows an action view of a device with a button in the prior art.
Figure 1:
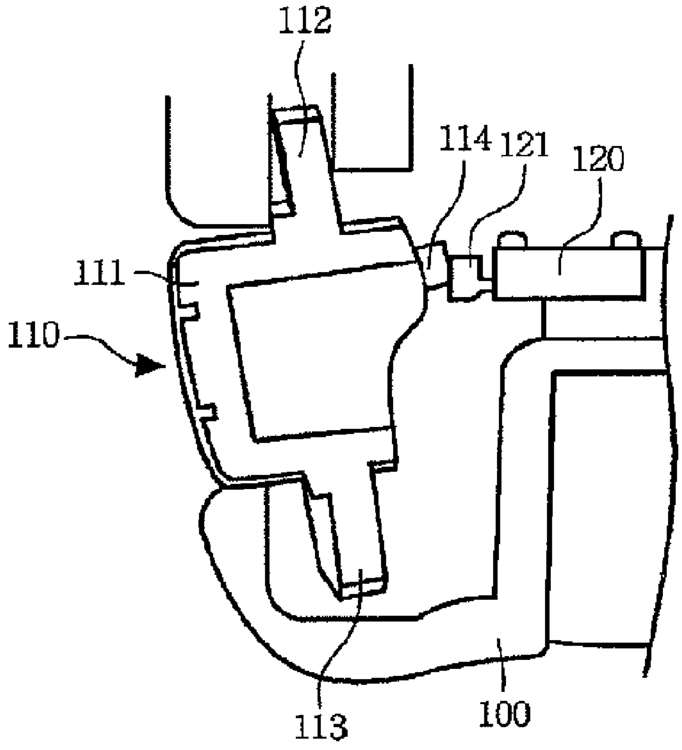
F I G . 1 b (Prior Art)
Figure 2A:
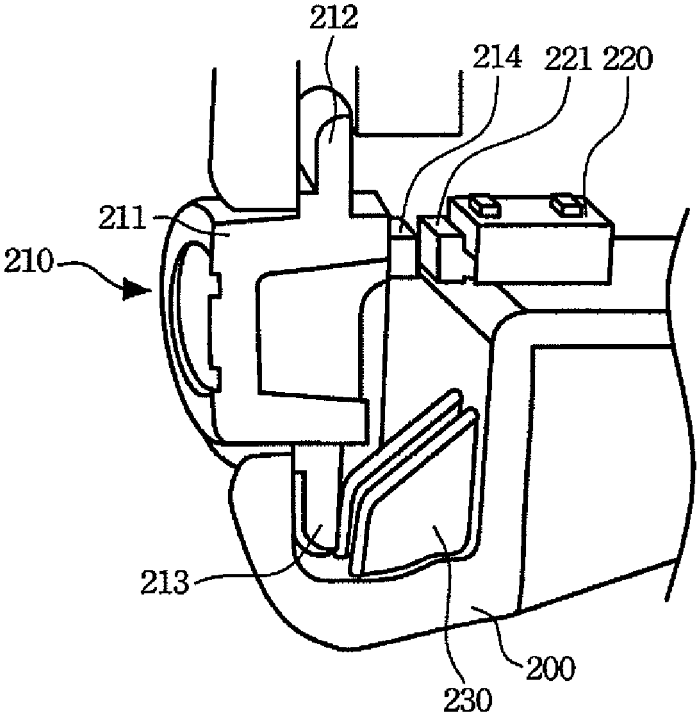
FIG. 2*a* shows a schematic view of a device with a button guiding element according to one embodiment of the present invention.

Referring to FIG. 2*a*, which illustrates a schematic view of a device with a button guiding element of one embodiment of the present invention. Similar to common structure in the prior art, the device includes a device substance 200, a button 210 and a circuit board 220.

The device substance 200 has a button opening, and the button 210 includes a button substance 211, a first fixing element 212, a second fixing element 213, and a driving element 214. The button substance 211, the first fixing element 212, and the second fixing element 213 may be designed to be integrated or integrally made as a whole member. The button substance 211 is located in the button opening and bulges out from the surface of the device substance 200, and the button substance 211 has a first side and a second side. The first fixing element 212 is fixed to the first side of the button substance 211 and engages with the device substance 200. The second fixing element 213 is fixed to the second side of the button substance 211. The second fixing element 213 is a cantilever beam and doesn't wedge with the device substance 200. The driving element 214 is located on the button substance 211 near the first side of the button substance 211. In one embodiment of the present invention, the circuit board 220 is located within the device substance 200 and has a driving point 221, which is located correspondingly to the driving element 214, as when the driving point 221 is spaced apart from and is aligned with the driving element 214, as shown in FIG. 2*a*. In one embodiment of the present invention, the driving element 214 is domed and made of rubber material or metal material. In one aspect of the present invention, the button guiding element 230 is disposed in the device substance 200 and has a purpose of restricting the motion of the second fixing element 213.

Figure 2B:
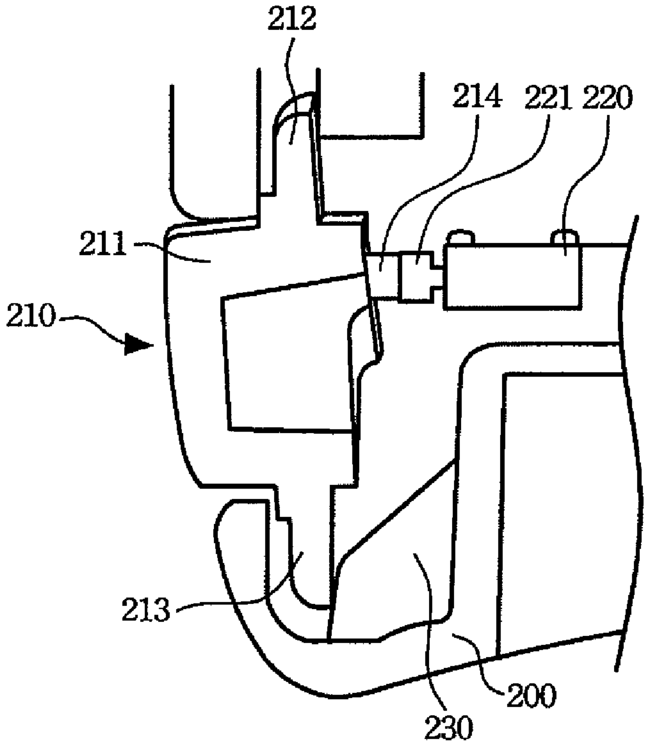
FIG. 2*b* shows an action view of a device with a button guiding element according to one embodiment of the present invention.

Referring to FIG. 2*b*, which illustrates an action view of a device with a button guiding element according to one embodiment of the present invention. When the button substance 211 is pressed, the button guiding element 230 restricts the motion of the second fixing element 213 and thereby guides the driving element 214 to activating the driving point 221 of the circuit board 220. The activated driven driving point 221 thus drives the circuit board 220 to perform functions.

In this invention, the button guiding element 230 is used to restrict the motion of the second fixing element 213. As a result, the button 210 can be supported so that the occurrence of situations in which the button 210 is obliquely positioned, the button 210 is stuck on being pressed, or the driving point 221 is damaged, can be reduced, and because a complete action of pressing the button 210 is enabled, the driving element 214 can contact the driving point 221 correctly.

As is understood by a person skilled in the art, the foregoing preferred embodiment of the present invention is an illustration, rather than a limiting description, of the present invention. It is intended to cover various modifications and similar arrangements included within the spirit and scope of the appended claims, the scope of which should be accorded the broadest interpretation so as to encompass all such modifications and similar structures.

We claim:

1. A device with a button guiding element, comprising:

a device substance having a button opening;

a button comprising:

a button substance located in the button opening and bulging out from the surface of the device substance, the button substance having a first side and a second side;

a first fixing element fixed to the first side of the button substance and engaging with the device substance;

a second fixing element fixed to the second side of the button substance; and a driving element located on the button substance;

the button guiding element capable of restricting the motion of the second fixing element; and a circuit board having a driving point, which is located correspondingly to the driving element, wherein when the button substance is pressed down, the button guiding element restricts the motion of the second fixing element and thereby guides the driving element to activate the driving point of the circuit board.

2. The device with the button guiding element according to claim 1, wherein said button substance, said first fixing element and said second fixing element are integrated as a whole member.

3. The device with the button guiding element according to claim 1, wherein said driving element is made of rubber material.

4. The device with the button guiding element according to claim 1, wherein said driving element is made of metal material.

5. The device with the button guiding element according to claim 1, wherein said second fixing element is a cantilever beam.

6. The device with the button guiding element according to claim 1 being applied to the group of cellular phone, camera, remote controller, and media player.

7. The device with the button guiding element according to claim 1, wherein said button guiding element is fixed in said device substance, capable of restricting the motion of said second fixing element.

8. The device with the button guiding element according to claim 1, wherein said driving element is located on said button substance near the first side of said button substance.

9. A device with a button guiding element, comprising:

a device substance having a button opening;

a button comprising:

a button substance located in the button opening and bulging out from the surface of the device substance, the button substance having a first side and a second side;

a first fixing element fixed to the first side of the button substance and engaging with the device substance;

a second fixing element fixed to the second side of the button substance; and a driving element located on the button substance;

the button guiding element capable of restricting the motion of the second fixing element; and a circuit board having a driving point, the driving point being spaced apart from and aligned with the driving element, wherein when the button substance is pressed down, the button guiding element restricts the motion of the second fixing element and thereby guides the driving element to activating the driving point of the circuit board.

* * * * *